United States Patent
Washio et al.

(10) Patent No.: US 6,214,135 B1
(45) Date of Patent: Apr. 10, 2001

(54) ENTRY BOARD FOR DRILLING SMALL HOLES, A METHOD OF MAKING THE SAME AND A METHOD FOR DRILLING SMALL HOLES THROUGH A PRINTED CIRCUIT BOARD BY USING SAID ENTRY BOARD

(75) Inventors: Yasushi Washio, Tokyo; Koji Miyano; Akio Fukuda, both of Tochigiken, all of (JP)

(73) Assignee: Showa Aluminum Corporation, Osaka (JP)

( * ) Notice: Subject to any disclaimer, the term of this patent is extended or adjusted under 35 U.S.C. 154(b) by 0 days.

(21) Appl. No.: 09/295,873

(22) Filed: Apr. 21, 1999

Related U.S. Application Data

(62) Division of application No. 08/797,458, filed on Feb. 6, 1997, now Pat. No. 6,000,886.

(30) Foreign Application Priority Data

Feb. 8, 1996 (JP) .................................................. 8-46668
Jan. 28, 1997 (JP) .................................................. 9-13970

(51) Int. Cl.⁷ .................................................. B23K 20/04
(52) U.S. Cl. .......................... 148/535; 228/115; 228/117
(58) Field of Search .................................. 148/531, 535; 228/115, 116, 117

(56) References Cited

U.S. PATENT DOCUMENTS

| | | | |
|---|---|---|---|
| 3,293,733 | * 12/1966 | Brovesman et al. | 428/654 |
| 3,664,890 | * 5/1972 | Winter | 148/535 |
| 4,019,826 | 4/1977 | Block | 408/1 |
| 4,500,028 | * 2/1985 | Breedis et al. | 228/117 |
| 4,699,674 | * 10/1987 | Finnegan | 148/535 |
| 4,906,534 | * 3/1990 | Bekki et al. | 148/535 |
| 5,032,468 | * 7/1991 | Dumont et al. | 428/636 |
| 5,785,465 | * 7/1998 | Korbonski | 408/1 R |
| 6,000,886 | * 12/1999 | Washio et al. | 408/1 R |

FOREIGN PATENT DOCUMENTS

| | | | |
|---|---|---|---|
| 60-155307 | * 8/1985 | (JP) | 408/1 R |
| 63-114948 | * 5/1988 | (JP) | 148/535 |
| 2-138446 | * 5/1990 | (JP) | 148/535 |
| WO 81/00367 | 2/1981 | (WO) . | |

OTHER PUBLICATIONS

Patent Abstracts of Japan, vol. 12, No. 206 (M–708), Jun. 14, 1988 & JP 63 011207 A, Jan. 18, 1988.

Patent Abstracts of Japan, vol. 16, No. 72 (M–1213), Feb. 21, 1992 & JP 03 261548 A, Nov. 21, 1991.

* cited by examiner

*Primary Examiner*—George Wyszomierski

(57) ABSTRACT

An entry board for drilling small holes having a front surface layer made of aluminum or aluminum alloy to be disposed at the drilling inlet side and a back surface layer made of aluminum or aluminum alloy to be disposed at the drilling outlet side. The back surface layer is adhered or joined by clad rolling to said front surface layer. The hardness of the front surface layer is smaller than that of the back surface layer.

7 Claims, 2 Drawing Sheets

ENTRY BOARD FOR DRILLING SMALL HOLES, A METHOD OF MAKING THE SAME AND A METHOD FOR DRILLING SMALL HOLES THROUGH A PRINTED CIRCUIT BOARD BY USING SAID ENTRY BOARD

This application is a divisional application of prior application Ser. No. 08/797,458 filed on Feb. 6, 1997, now U.S. Pat. No. 6,000,886.

FIELD OF THE INVENTION.

The present invention relates to an entry board for drilling small holes, e.g. having a diameter of 0.1 mm–2.0 mm, through an article requiring high accuracy such as a printed circuit board, and also relates to a method of making the entry board and further relates to a method for drilling small holes through a printed circuit board by using the entry board.

BACKGROUND OF THE INVENTION

Electronic techniques have been widely applied in various kinds of fields including not only the electric or communication fields of telephones, televisions, computers (including personal computers), lights and controlling devices utilized in various kinds of manufacturing industries, but also other fields including automobiles, office electronic supplies, cameras, toys, and the like. At the same time, the techniques have required high performance and high accuracy. Thus, in the fields of printed circuit boards, circuit patterns formed on the board have rapidly become more minute, as well as high density and multi-layered. As a result, the width of each circuit pattern and the distance therebetween have become narrower. Especially, in printed circuit boards of a through hole type, the holes have become smaller in diameter, and the number of holes has been increased. Further, the positions of holes have required high accuracy.

In drilling holes through a multilayered board, drilling small holes each having a diameter of 0.3–0.4 mm has been conventionally conducted. Recently, drilling much smaller holes each having a diameter of 0.1–0.3 mm has been practically conducted, and such demands as drilling smaller holes and increasing the number of holes with higher accuracy of drilling to position will be further required.

In drilling such small holes, as shown in FIG. 4, it has been known that placing an entry board 1 on a printed circuit board 5 enables easy introduction of a drill 8 which in turn improves accuracy of the drilling positions of a hole 9 drilled on the printed circuit board 5 and also enables drilling holes without causing burrs, or the like, around the holes. There have been several proposals concerning such entry boards.

Japanese Patent Publication 61-61921 (hereinafter referred to as JP 61-61921) discloses a method for drilling through a printed circuit board by using an entry board. The entry board comprises a base plate made of wood pulp and glass fiber and aluminum foils or the like covering both surfaces of the base plate. Japanese Patent Unexamined Publication SHO 62-214000 (hereinafter referred to as JP 62-214000) discloses a method for drilling a printed is circuit board by using an entry board which comprises a base plate made of aluminum foils and papers covering both surfaces of the base plate. Japanese Patent Unexamined Publication SHO 63-11207 (hereinafter referred to as JP 63-11207) discloses a method for drilling through a printed circuit board by placing an entry board made of metallic foil on the printed circuit board and by way of an adhesive layer formed on one surface of the metallic foil.

However, in the method disclosed in JP 61-61921, because hard materials such as JIS (Japanese Industrial Standard) 3003-H19 homogenized aluminum alloy as the aluminum foils are used as a surface layer of an entry board, a drill tends to slip on the aluminum foil, resulting in decreased drill positioning accuracy. Further, in such a case that adhesive layers are used to connect the aluminum foils to the base plate, the entry board becomes a five-layered structure, resulting in an increased manufacturing cost. In the disclosure of JP 62-214000, the paper thereof lacks heat-resistance ability and paper dust is generated during drilling, resulting in problems in the following procedures such as a plating procedure. Further, in the method disclosed in JP 63-11207, it is unavoidable to have the sticking of chips produced when drilling to the adhesive layers.

As mentioned above, in the conventional methods, there have still been problems in drilling small holes. Further, as the pattern formed on the printed circuit board reduces in size, the size of each hole to be drilled becomes smaller and the number of the holes increases, the rotation speed of the drill becomes higher and the diameter of the drill becomes smaller which results in rotational deflection of the drill. Furthermore, there have been more strict demands for improving accuracy of the drilling position and decreasing the allowable height of burrs. In spite of such demands, as the above mentioned conventional entry boards are still being used, accuracy of the drilling position has not been improved and drill breakages occur when it is attempted to improve the accuracy of the drilling position and to decrease the generation of burrs.

SUMMARY OF THE INVENTION

In view of the foregoing disadvantages that are inherent in conventional entry boards, the present invention aims to provide an improved entry board for drilling small holes through a printed circuit board, or the like, which enables easy introducing of a drill, improving accuracy of drilling position by restraining slipping of a drill on the surface of the entry board, increasing the number of work items ("works") to be drilled such as a printed circuits board at one time, decreasing the number of drill breakages and further decreasing the generation of burrs.

It is also an object of the invention to provide a method for making the entry board mentioned above.

It is another object of the invention to provide a method of drilling small holes by using the entry board mentioned above.

The above and other objects are accomplished by an entry board including a front surface layer made of aluminum or aluminum alloy disposed on a drilling inlet side, a back surface layer made of aluminum or aluminum alloy disposed on a drilling outlet side, wherein both the layers are bonded together or are joined by clad rolling, and wherein hardness of the front surface layer is smaller than that of the back surface layer.

Because of the front surface layer having smaller hardness, a drill can easily be introduced, accuracy of drilling position can be improved and slipping of a drill on the entry board can be restrained, vibration of a rotating drill caused by a thin drill can be effectively restrained and drill breakages can be decreased. On the other hand, because of the back surface layer having higher hardness, generation of burrs can be decreased.

Thickness of the front surface layer may preferably fall within the range of from 5 to 100 $\mu$m and micro vickers hardness (Hv) of the front surface layer may fall within the range of from 20–50. Thickness of the back surface layer may preferably fall within the range of from 30–200 μm and micro vickers hardness (Hv) of the back surface layer may exceed 50, but does not exceed 140.

Roughening treatment may preferably be conducted on the surface of the front layer to obtain a central average roughness (Ra) of 0.15–0.30 μm. This treatment is effective to prevent a drill from slipping when drilling and improves accuracy of drilling position. However, hardness of the front surface layer most effectively contributes to improvement of the accuracy of the drilling position. The next important contributions to such improvement include thickness and surface roughness.

The above objects are also accomplished by a method for making an entry board. The method includes the steps of clad rolling a pure aluminum alloy sheet to be composed of a surface layer and an Al—Mn aluminum alloy to be composed of a back surface layer, and then annealing them at the temperature of 200–260° C. This method easily enables one to differentiate hardness of both of the layers by utilizing softening characteristics thereof.

Furthermore, the above objects are accomplished by a method for drilling small holes through a printed circuit board. The method includes the steps of preparing an entry board. The entry board includes a front surface layer made of aluminum or an aluminum alloy to be disposed on a drilling inlet side and a back surface layer made of aluminum or an aluminum alloy to be disposed on a drilling outlet side. The front surface layer is glued together by an adhesive layer or joined by clad rolling, and hardness of the front surface layer is smaller than that of the back surface layer. The method also includes the steps of placing the entry board on piled printed circuit boards such that the back surface layer contacts a printed circuit board, and drilling through the printed circuit boards together with the entry board. This method enhances productivity of drilling with high accuracy.

The above and other objects and features of the present invention will be apparent from the following detailed description of the invention with reference to the attached drawings.

DETAILED DESCRIPTION OF THE PREFERRED EMBODIMENTS

Figure 1:
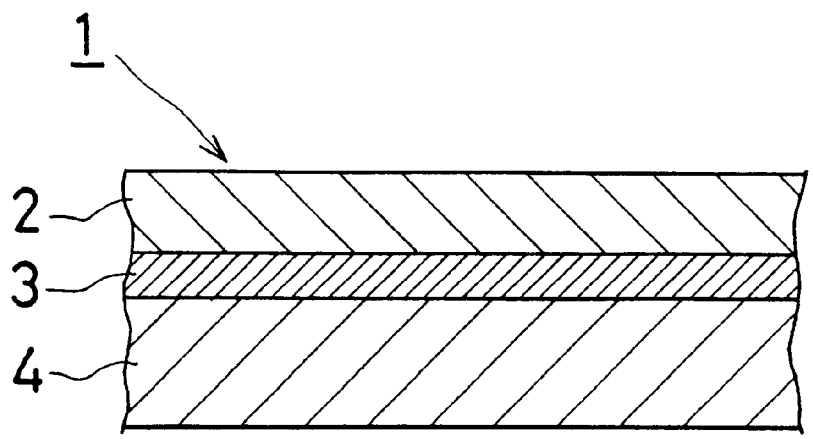
FIG. 1 is an enlarged cross-sectional view of an entry board for drilling small holes according to the first embodiment of the present invention.

Preferred embodiments of the present invention will now be described, in detail, with reference to the accompanying drawings.

An entry board according to the present invention is made of aluminum or aluminum alloy. An entry board 1 according to the first embodiment shown in FIG. 1 includes a front surface layer 2 made of aluminum or aluminum alloy and a back surface layer 4 made of aluminum or aluminum alloy. Both of the layers 2 and 4 are glued together by way of an adhesive layer 3. On the other hand, an entry board 1 according to the second embodiment shown in FIG. 2 is a two-layer structure joined by clad rolling.

The front surface layer 2 is to be disposed at a drilling inlet side and the back surface layer 4 is to be disposed at a drilling outlet side. Hardness of the front surface layer 2 should be smaller than that of the back surface layer 4. The reasons are as follows.

Though it is effective to reduce height of burrs if the hardness of an entry board is high, the drill tends to slip when a drill contacts the surface of the entry board, thereby decreasing the accuracy of the drilling position. On the other hand, though it is easy to keep the accuracy of centering the drill if the hardness of an entry board is low, it is inevitable to increase the generation of burrs.

In the present invention, to accomplish these opposite demands, i.e., a demand for improving accuracy of drilling position by preventing slipping of a drill and a demand for decreasing the height of burrs, as a front surface layer 2 to which a drill contacts at first when drilling soft materials are used to prevent slipping of a drill, and as a back surface layer 4 hard layer materials having a hardness higher than the front surface layer 2 are used to prevent generating burrs.

As a result, demands, such as the improvement of the accuracy of the drilling position on a printed circuit board whose pattern formed thereon has rapidly reduced in size, the minimization of the height of burrs, and the reduction of drill breakages, have been satisfied. Since the height of a burr becomes lower, the number of printed circuit boards to be drilled at one time can be increased, thereby enhancing drilling productivity. Further, decreasing the height of burrs is effective for preventing the causing of damages to circuits made of copper foils on a printed circuit board. Thus, an improved entry board and a method for drilling small holes through a printed circuit board by using the entry board has been successfully developed.

Thickness of the front surface layer 2 should be determined depending on a diameter of a drill to be used. Too thick of a front surface layer relative to the diameter of the drill causes clinging on the drill due to its soft layer. Thus, the thickness should be determined depending on a diameter of a drill to be used. Generally, thickness of the front surface layers 2 falls within the range of from 5 to 100 μm, and preferably from 5 to 50 μm where a diameter of a drill is not larger than 0.5 mm. The micro vickers hardness (Hv) of the surface layer 2 falls within the range of from 20 to 50, more preferably from 25 to 40. It is necessary to soften materials of the surface layer so as to easily introduce the drill. Easy introducing of the drill can prevent the drill from slipping and can improve accuracy of drilling position.

As for the back surface layer 4, the thickness thereof may preferably fall within the range of from 30 to 200 μm. Micro vickers hardness (Hv) of the layer may preferably exceed 50, but does not exceed 140. More preferably, in the adhesive type shown in FIG. 1, micro vickers hardness (Hv) falls within the range of from 65 to 140, and in the clad rolled type shown in FIG. 2. from 58 to 140. The back surface layer mentioned above can decrease the height of burrs compared to that of burrs generated during conventional drilling procedures or can at least restrict the height of burrs to the same level of that of burrs generated during conventional drilling procedures.

The preferable total thickness of the entry board 1 varies depending on the diameter of the drill 8 to be used. The thickness of the entry board 1 should be thick where the diameter of the drill is large. On the contrary, the thickness of the entry board 1 should be thin where the diameter of the drill is small. Where the diameter of the drill is not more than 0.5 mm, the total thickness of the entry board 1 may preferably be 30 to 200 μm, more preferably 50–100 μm. As apparent from the above, the thickness of the back surface layer 4 is determined by the thickness of the front surface of the layer 2.

The surface roughness of the aluminum foil used as an entry board which is now being used is generally 0.1 μm or the like in the central average roughness (Ra) and causes no problems so far. However, in a case that the drilling of small holes through a printed circuit board with a higher performance is required, even if the surface materials of the entry board to which a drill contacts first is soft, such as micro vickers hardness of 20–50, the entry board having such a surface of high flatness may cause slipping of the drill when the drill contacts the surface, thereby lowering the accuracy of the drilling position. To prevent slipping, the surface of the front surface layer 2 of the entry board 1 is preferably roughened so that the central average roughness (Ra) falls within the range of from 0.15–0.30 μm. This can prevent slipping of the drill and can improve the accuracy of the drilling position.

When the central average roughness (Ra) of the surface is less than 0.15 μm, slipping of a drill cannot be effectively prevented. On the contrary, when the roughness exceeds 0.30 μm, a burden to be loaded to the drill when it contacts the entry board at first becomes large and may cause drill breakages.

When drilling through a plurality of printed circuit boards stacked one on another, if the drill is inserted in an inclined state, large drilling position errors can occur at the lowermost printed circuit board. In drilling small holes, a drilling position error of 5 μm is serious. Thus, it is important to roughen the surface of the entry board.

Roughening the surface of the front surface layer 2 enables one to easily distinguish the front surface layer 2 from the back surface layer 4 in actual use so as to avoid mistakes.

Figure 2:
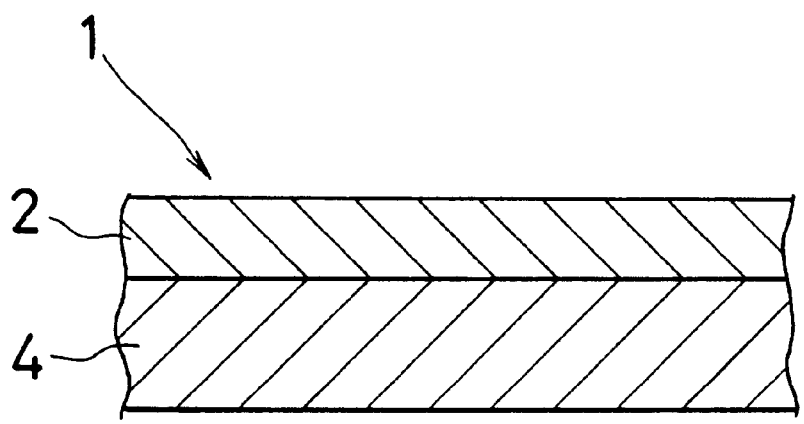
FIG. 2 is an enlarged cross-sectional view of an entry board for drilling small holes according to the second embodiment of the present invention.

The entry board according to the first embodiment shown in FIG. 1 is produced by bonding the front surface layer 2 and the back surface layer 4, each made of aluminum or aluminum alloy foil, by way of an adhesive layer 3. As for the materials of the front surface layer 2 and the back surface layer 4, the compositions are not limited so long as their hardness fall within the ranges as described above. Pure aluminum or other aluminum alloys can be used. JIS 1085, 1N30, 1050, 1100 or 3003 aluminum is preferably used. JIS 1085, 1N30 and 3003 aluminum are more preferably used because they are excellent in rolling performance and are generally used. An Al—Si aluminum alloy is not recommended to be used as materials of the layers because the alloy includes Si which causes heavy abrasion to the drill. Under the condition that the front surface layer 2 is disposed at a drilling inlet side and the back surface layer 4 is disposed at a drilling outlet side, each layer 2 or 4 is not limited to one sheet of an aluminum or an aluminum alloy layer, but may include a plurality of laminated layers.

As for the adhesive layer 3, adhesive materials which do not cause clinging to the drill by heat generated during drilling, such as thermosetting acryl, polyamide, rubber, epoxy, urethane adhesive, may be used. Urethane adhesive is preferably used in light of its high performance and low cost. Though the thickness of the adhesive layer is not limited, the amount of the adhesive layer generally falls within the range of from 1–5 g/m². The adhesive layer thicker than the above increases the cost.

Preferable methods for producing the entry board 1 according to the second embodiment shown in FIG. 2 will now be described. below.

First, materials to be a front surface layer 2 and a back surface layer 4 are prepared. The components of the materials of the front surface layer 2 and the back surface layer 4 are not limited where the hardness falls within the range mentioned above. Pure aluminum or the other aluminum alloys may be used. However, as will be mentioned below, in order to be able to differentiate the hardness of the front surface layer 2 and the back surface layer 4 by annealing which will be performed after joining the front surface layer 2 and the back surface layer 4 by clad rolling, pure aluminum alloys such as JIS 1N30, 1050, 1100 may be used as the front surface layer 2 and Al—Mn alloys such as JIS 3003, 3004 or Al—Mn—Mg alloy such as JIS 5182 may be used as the back surface layer 4. An Al—Si alloy is not recommended to be used as materials of the layers because the alloy includes Si which causes heavy abrasion to the drill. Under the condition that the front surface layer 2 is disposed on the drilling inlet side and the back surface layer 4 is disposed on the drilling outlet side, each layer 2 or 4 is not limited to one sheet of an aluminum layer but may include a plurality of cladded layers.

Then, the above-mentioned materials for a front surface layer 2 and a back surface layer 4 are placed one on another and then clad rolled. The clad rolling may be conducted under the normal conditions. Preferably, as mentioned above, the rolling procedure is conducted such that the front surface layer 2 becomes 5–100 μm in thickness and the back surface layer 4 becomes 30–200 μm in thickness and the obtained entry board materials are wound to be a coil.

Figure 3:
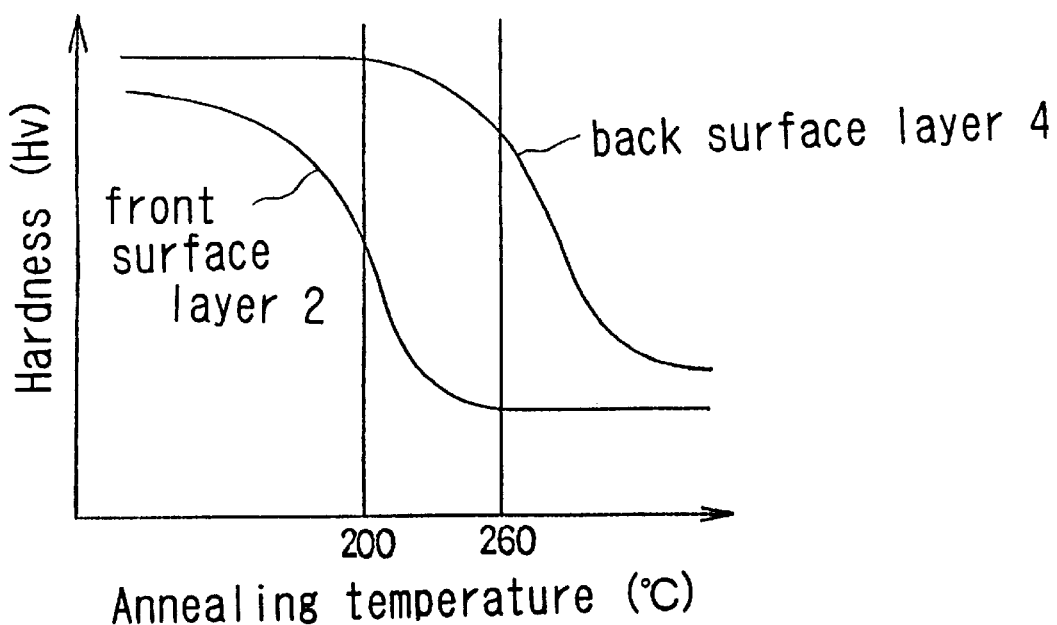
FIG. 3 is a graph showing the relationship between hardness (Hv) and annealing temperature (° C.) of the front and back surface layers according to the second embodiment.

Then, the entry board materials are annealed. As shown in the graph in FIG. 3 showing softening performance, a pure aluminum alloy-comprising the front surface layer 2 and Al—Mn alloy or Al—Mn—Mg alloy comprising the back surface layer 4 are different in the softening performance. By utilizing this characteristic, a front surface layer 2 and a back surface layer 4 which are different in hardness can be obtained by controlling the temperature conditions. Concretely, the annealing is conducted at the temperature of 200–260° C. By setting the temperature mentioned above, as the softening the front surface layer 2 is enhanced and the softening the back surface layer 4 is delayed, a predetermined difference in hardness between both layers is generated. Thus, the front surface layer 2 becomes softer than the back surface layer 4. If the annealing temperature is lower than 200° C., softening of both of the layers will not be performed. Thus, it is difficult to differentiate the hardness between them. On the other hand, if the temperature exceeds 260° C., softening of the back surface layer 4 is also performed. Thus, it is also difficult to differentiate the hardness between them.

The annealing may be a batch annealing in which annealing is conducted in a coiled state, or may be a continuous annealing in which annealing is continuously conducted while uncoiling. However, the continuous annealing is preferable because of the following merits. The materials positioned at the surface side of the coil and the materials positioned at the innermost side of the coil can be annealed at an even temperature. The required time for annealing is short. When an aluminum alloy including Mg is used as materials, in the batch annealing, it is required to conduct it in an inert gaseous atmosphere so as not to cause precipitation of Mg which looks white. However, in the continuous annealing, the annealing will be accomplished before causing precipitation of Mg, because the required annealing time is short. Thus, the aluminum alloy does not become white. In a continuous annealing, the annealing time may preferably be 5–60 seconds because less than 5 seconds is not enough time to anneal them and exceeding 60 seconds may cause softening of the back surface layer 4. In a batch annealing, the annealing time may preferably be 10–30 hours because not more than 10 hours is not enough time to anneal them but exceeding 30 hours may cause softening of the back surface layer 4.

In order to roughen the surface of the front surface layer 2 such that the central average roughness (Ra) is 0.15–0.30 μm, rolling may be performed by using a roll having a rough surface (Ra=0.15–0.30 μm) at the front surface layer 2 side and a roll having a normal rough surface (Ra=0.1 μm or the like) at the back surface layer 4 side.

Figure 4:
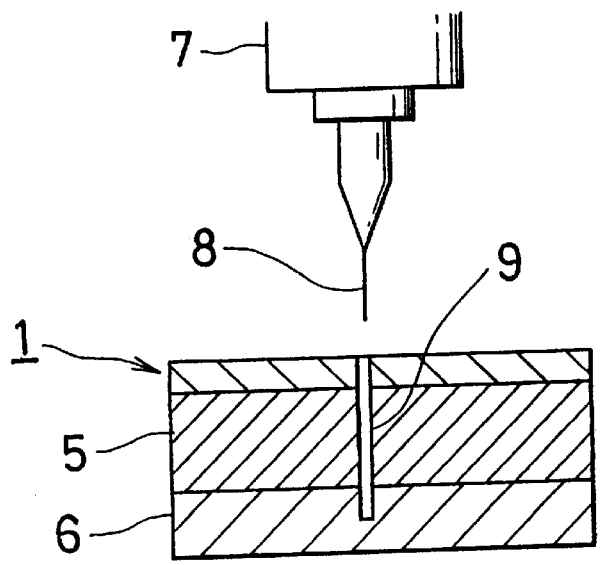
FIG. 4 is a schematic view showing drilling small holes through a printed circuit board by using an entry board.

The entry board 1 according to the present invention is placed such that the back surface layer 4 contacts one or a plurality of stacked printed circuit boards 5 as shown in FIG. 4 and then drilled by a drill S. In FIG. 4, the numeral 6 denotes a backup board and the numeral 7 denotes a spindle.

(Embodiment 1)

This embodiment relates to a bonded structural entry board 1 as shown in FIG. 1.

As composing materials of the front surface layer 2, materials denoted as JIS homogenized symbol "O" and "H14" of JIS 1N30 aluminum alloy, and materials denoted as JIS homogenized symbol "O" of JIS 3003 aluminum alloy have been prepared. As composing materials of the back surface layer 4, materials denoted as JIS homogenized symbol "H18" and "H19" of JIS 3003, JIS 3004 and JIS 5182 having thickness are shown in Table 1. The above mentioned JIS homogenized symbol "O" stands for the most softened state, and JIS homogenized symbol "H" stands for a hardened state.

Each material of the front surface layer 2 and back surface layer 4 were combined as shown in Table 1 and bonded by way of an adhesive layer to form various kinds of entry boards.

Also, prepared were entry boards comprising a simple substance made of materials denoted as JIS homogenized symbol "H18" of each JIS 1100 and JIS 3003 aluminum alloy as comparisons.

Each entry board prepared above was used to drill through a printed circuit board and then evaluated. The drilling was performed as follows. The entry board, two pieces of 6 laminated glass-epoxy layer each having thickness of 1.6 mm, and a backup board made of a paper-phenol laminated layer having a thickness of 1.6 mm were piled one on another and were drilled under the following conditions.

| Drilling bit: | 0.35 mm width |
| Rotation Speed: | 80000 rpm |
| Sending speed: | 1.6 mm/min. |

The hardness and thickness of the front and back surface layers of each entry board, the central average roughness (Ra) of the front surface layer 2, the accuracy of drilling position after drilling and the height of the burrs are shown in Table 1.

The micro vickers hardness (Hv) was measured by the Dynamic Super Micro Hardness Measuring Apparatus of SHIMADZU SEISAKUSYO, LTD. (Model: DUH-201) under the conditions of a load: 5 gf, holding time: 5 seconds and loading speed: 0.3375 gf/second.

TABLE 1

| | Front Surface layer | | | | | Back Surface Layer | | | | Evaluation | | |
|---|---|---|---|---|---|---|---|---|---|---|---|---|
| Sample No. | Aluminum Materials | Homogenization | Hardness (Hv) 1) | Thickness (μm) | Surface roughness (Ra:μm) | Aluminum Materials | Homogenization | Hardness (Hv) 1) | Thickness (μm) | Max. drilling position error (μm) 2) | Drill breakage 3) | Height of burr 4) |
| EMBODIMENT | | | | | | | | | | | | |
| 1 | 1N30 | 0 | 26 | 30 | 0.10 | 3004 | H19 | 85 | 70 | 45 | 3000 holes OK | 4 |
| 2 | 1N30 | 0 | 26 | 30 | 0.15 | 3004 | H19 | 85 | 70 | 35 | —5) | —5) |
| 3 | 1N30 | 0 | 26 | 30 | 0.19 | 3004 | H19 | 85 | 70 | 35 | 3000 holes OK | 4 |
| 4 | 1N30 | 0 | 26 | 30 | 0.28 | 3004 | H19 | 85 | 70 | 40 | —5) | —5) |
| 5 | 1N30 | 0 | 26 | 30 | 0.34 | 3004 | H19 | 85 | 70 | 55 | —5) | —5) |
| 6 | 1N30 | 0 | 26 | 30 | 0.10 | 3003 | H18 | 65 | 70 | 45 | 3000 holes OK | 5 |
| 7 | 1N30 | 0 | 26 | 30 | 0.19 | 3003 | H18 | 65 | 70 | 35 | 3000 holes OK | 5 |
| 8 | 1N30 | 0 | 26 | 20 | 0.10 | 5182 | H18 | 138 | 80 | 45 | 3000 holes OK | 3 |
| 9 | 1N30 | H14 | 38 | 30 | 0.10 | 3004 | H19 | 85 | 70 | 45 | 3000 holes OK | 4 |
| 10 | 3003 | 0 | 36 | 30 | 0.10 | 3004 | H19 | 85 | 70 | 40 | 3000 holes OK | 4 |
| COMPARISON | | | | | | | | | | | | |
| 1 | 3003 | H18 | 65 | 150 | 0.095 | Non-clad | | | | 70 | 1700 holes NG | 6 |
| 2 | 1100 | H18 | 55 | 150 | 0.09 | Non-clad | | | | 70 | 1900 holes NG | 8 |

1) Hardness: Micro Vickers Hardness (Hv)
2) Maximum drilling position error (μm)
3) Drill breakage: 3000 holes OK; No Drill breakage was occurred when 3000 holes were made. 1700 holes NG; Drill breakage was occurred when 1700 holes were made.
4) Height of burr: Maximum height of burr after 1000 holes were made (μm).
5) Unmeasured (Embodiment 2)

This embodiment relates to an entry board 1 joined by clad rolling as shown in FIG. 2.

As composing materials of the front surface layer 2, JIS 1N30 which is a pure aluminum alloy was prepared. As composing materials of the back surface layer 4, JIS 3003 and JIS 3004 of Al—Mn aluminum alloy and JIS 5182 of Al—Mn—Mg aluminum alloy were prepared.

Each composing materials of the front and back surface layers 2 and 4 was clad-rolled under the normal conditions and annealed under the conditions shown Table 1 to prepare entry boards. The annealing was continuously conducted while uncoiling. The surface of the front surface layer 2 was roughened by adjusting the surface roughness of the press roll which contacts the front surface layer 2 during the final stage of the rolling procedure.

The above-mentioned entry boards were used to drill through a printed circuit board under the same conditions applied to the first embodiment and then evaluated.

The materials, homogenization, hardness and thickness of the front and back surface layer of each entry board and the central average roughness (Ra) of the front surface layer 2 are shown in Table 2. The accuracy of the drilling position after drilling and the height of the burrs are shown in Table 3.

As understood from Tables 1–3, the entry board according to the present invention is effective to minimize maximum hole position errors, height of burrs and drill breakages.

Since the entry board for drilling small holes according to the present invention includes a front surface layer made of aluminum or aluminum alloy to be disposed at a drilling inlet side and a back surface layer made of aluminum or aluminum alloy to be disposed at a drilling outlet side, wherein the front surface layer is bonded to the back surface layer by way of an adhesive layer or joined by clad rolling, and wherein the hardness of the front surface layer is smaller than that of the back surface layer, the following effects can be obtained.

Since the entry board is mainly made of aluminum foil, a drill can be kept clean and heat generated during a drilling procedure can be effectively diffused.

Since the front surface layer is made of soft materials, a drill can easily be inserted into the surface of the front surface layer, slipping of a drill can be prevented, accuracy

TABLE 2

| | Front Surface Layer | | | | Back Surface Layer | | | | Annealing | | |
|---|---|---|---|---|---|---|---|---|---|---|---|
| Sample No. | Aluminum Materials | Homogenization | Hardness (Hv) 6) | Thickness (μm) | Surface roughness (Ra:μm) | Aluminum Materials | Homogenization | Hardness (Hv) 6) | Thickness (μm) | Method | Temperature (° C.) | Time (sec) |
| EMBODIMENT | | | | | | | | | | | | |
| 11 | 1N30 | 0 | 26 | 75 | 0.10 | 3003 | (H28) 7) | 61 | 75 | continuous annealing | 230 | 10 |
| 12 | 1N30 | 0 | 26 | 75 | 0.19 | 3003 | (H28) 7) | 61 | 75 | continuous annealing | 230 | 10 |
| 13 | 1N30 | 0 | 26 | 75 | 0.34 | 3003 | (H28) 7) | 61 | 75 | continuous annealing | 230 | 10 |
| 14 | 1N30 | (H24) 7) | 40 | 75 | 0.10 | 3003 | (H28) 7) | 63 | 75 | continuous annealing | 250 | 10 |
| 15 | 1N30 | (H24) 7) | 40 | 75 | 0.19 | 3003 | (H28) 7) | 63 | 75 | continuous annealing | 250 | 10 |
| 16 | 1N30 | 0 | 26 | 30 | 0.10 | 3003 | (H28) 7) | 61 | 70 | continuous annealing | 230 | 10 |
| 17 | 1N30 | (H24) 7) | 40 | 30 | 0.19 | 3003 | (H28) 7) | 63 | 70 | continuous annealing | 250 | 10 |
| 18 | 1N30 | 0 | 26 | 75 | 0.10 | 3004 | (H28) 7) | 81 | 75 | continuous annealing | 230 | 10 |
| 19 | 1N30 | (H24) 7) | 40 | 30 | 0.19 | 3004 | (H28) 7) | 83 | 70 | continuous annealing | 250 | 10 |
| 20 | 1N30 | 0 | 26 | 30 | 0.10 | 5182 | (H28) 7) | 120 | 70 | continuous annealing | 220 | 10 |

6) Hardness: Micro Vickers Hardness (Hv)
7) Though there is no JIS standard for mid-hardness in Aluminum toil, the homogenization corresponds to "H24" and "H28" of Aluminum.

TABLE 3

| | Evaluation | | |
|---|---|---|---|
| Sample No. | Max. drilling position error (μm) 8) | Drill breakage 9) | Height of burr 10) |
| EMBODIMENT | | | |
| 11 | 35 | 3000 holes OK | 5 |
| 12 | 30 | 3000 holes OK | 5 |
| 13 | 50 | 3000 holes OK | 5 |
| 14 | 45 | 3000 holes OK | 4 |
| 15 | 40 | 3000 holes OK | 4 |
| 16 | 45 | 3000 holes OK | 5 |
| 17 | 50 | 3000 holes OK | 4 |
| 18 | 40 | 3000 holes OK | 4 |
| 19 | 55 | 3000 holes OK | 4 |
| 20 | 55 | 3000 holes OK | 3 |

8) Maximum drilling position error (μm)
9) Drill breakage: 3000 holes OK; No drill breakage was occurred when 3000 holes were made.
10) Height of burr: Maximum height of burr after 1000 holes were made (μm)

of the drilling position can be improved, drill breakages can be prevented and vibration of a rotating drill, e.g., caused by a thin drill, can be restricted.

Since the back surface layer is made of a harder material, burrs can be prevented from being generated. Thus, it enables one to drill through a plurality of materials to be drilled at one time, thereby enhancing the productivity. As the height of burrs are restricted as mentioned above, it is effective to prevent the breakage of copper foil forming circuits on a printed circuit board. Thus, reduced pattern circuits can be effectively prevented from being destroyed.

The above effects can be surely and stably obtained under the condition that the thickness of the front surface layer is 5–100 μm, the micro vickers hardness (Hv) of the front surface layer is 20–50, the thickness of the back surface layer is 30–200 μm. and the micro vickers hardness (Hv) of the back surface layer exceeds 50, but does not exceed 140.

If roughening surface treatments are performed such that a central average roughness is 0.15–0.30 μm, slipping of the drill when drilling can be prevented, thereby further enhancing accuracy of drilling position. Furthermore, it enables one to easily distinguish the front surface layer from the back surface layer in actual use—thus, preventing improper placement of the entry board upside down.

If the method for making an entry board including the steps of clad rolling a pure aluminum alloy to be a front surface layer and an Al—Mn aluminum alloy or Al—Mn—Mg alloy to be a back front surface layer to form a laminated board and thereafter annealing the laminated board at the temperature of 200–260° C. is employed, the hardness of the front and back surface layers can be easily differentiated by utilizing softening characteristics thereof by annealing in an easily handled laminated state. Thus, an entry board can be efficiently manufactured by such a simple method.

If the entry board mentioned above is used for drilling small holes through a printed circuit board, the drilling can be performed with a high accuracy.

Although the invention has been described in connection with specific embodiments, the invention is not limited to such embodiments and as would be apparent to those skilled in the art, various substitutions and modification within the scope and spirit of the invention are contemplated.

What is claimed is:

1. A method for making an entry board for drilling small holes, comprising the steps of:

clad rolling substantially pure aluminum or an aluminum alloy selected from the group consisting of JIS 1085, 1N30, 1050, or 1100 comprising a front surface layer and an Al—Mn alloy or an Al—Mn—Mg alloy comprising a back surface layer to obtain a clad member; and annealing said clad member at a temperature of 200–260° C. to obtain an annealed clad member, wherein the hardness of the front surface layer of the annealed clad member is smaller than that of the back surface layer of the annealed clad member.

2. The method for making an entry board for drilling small holes as recited in claim 1, wherein micro vickers hardness (Hv) of said front surface layer after said annealing is 20–50, micro vickers hardness (Hv) of said back surface layer after said annealing exceeds 50 but does not exceed 140.

3. The method for making an entry board for drilling small holes as recited in claim 2, wherein the micro vickers hardness (Hv) of said front surface layer after said annealing is 25–40.

4. The method for making an entry board for drilling small holes as recited in claim 2 or 3, wherein the micro vickers hardness (Hv) of said back surface layer after said annealing is 58–140.

5. The method for making an entry board for drilling small holes as recited in claim 1, wherein the clad rolling is performed so that thickness of the front surface layer becomes 5–100 $\mu$m and the thickness of the back surface layer becomes 30–200 $\mu$m.

6. The method for making an entry board for drilling small holes as recited in claim 1, wherein a surface of said front surface layer is roughened after or before said annealing such that central average roughness (Ra) of the surface becomes 0.15–0.30 $\mu$m.

7. The method for making an entry board for drilling small holes as recited in claim 1, further comprising a step of coiling said clad member after said clad rolling to obtain a coiled clad member, wherein said annealing is continuously performed while uncoiling said coiled clad member for 5–60 seconds.

* * * * *